US005210806A

United States Patent [19]

Kihara et al.

[11] Patent Number: 5,210,806

[45] Date of Patent: May 11, 1993

[54] DIGITAL AUDIO SIGNAL PROCESSING APPARATUS

[75] Inventors: Hisashi Kihara; Shinjiro Kato; Fumio Tamura; Shuichi Mori, all of Kawagoe, Japan

[73] Assignee: Pioneer Electronic Corporation, Tokyo, Japan

[21] Appl. No.: 598,380

[22] Filed: Oct. 16, 1990

[30] Foreign Application Priority Data

Nov. 7, 1989 [JP] Japan ................................ 1-289246

[51] Int. Cl.[5] ................................................ H03G 5/00

[52] U.S. Cl. .................................... 381/103; 381/102; 381/24; 333/28 T

[58] Field of Search ................. 381/103, 101, 98, 102, 381/1, 24; 333/28 T, 28 R

[56] References Cited

U.S. PATENT DOCUMENTS 4,661,982 4/1987 Kitazato et al. .................... 381/103

FOREIGN PATENT DOCUMENTS 0090464 10/1983 European Pat. Off. ............ 381/101
3306306 4/1988 Fed. Rep. of Germany .
0117202 5/1990 Japan .................................. 381/113

OTHER PUBLICATIONS

Radio Shack 1992 Catalog, p. 59.
Design Aspects of Graphic Equalizers, R. A. Greiner and Michael Schoenon, Jun. 83, J. Audio Eng. Soc., vol. 31, No. 6.

*Primary Examiner*—Jin F. Ng
*Assistant Examiner*—Nina Tong
*Attorney, Agent, or Firm*—Perman & Green

[57] ABSTRACT

Disclosed herein is a digital audio signal processing apparatus of a type wherein a graphic equalizer including a plurality of filters connected in series to one another is subjected to arithmetic operation processing to be defined to thereby output the result of its processing as data therefrom. When a change-over command is generated, one filter out of the plurality of filters except for filters positioned at both ends is supplied to one of two output terminals with output data of a filter immediately before said one filter, the stored data is applied to the input of a filter immediately after said one filter and output data of a final filter is applied to the other of said two output terminals so as to define two graphic equalizers. Thus, where it is desired to carry out a change in the mode from arithmetic operation processing which defines a graphic equalizer comprising a plurality of bands to arithmetic operation processing which defines two-separated graphic equalizers comprising a plurality of bands or to the contrary, where it is desired to carry out a change in the mode contrary to the mode referred to above, the change in the arithmetic operation processing can be completed in a relatively short time.

4 Claims, 4 Drawing Sheets

| ORDER | ROUTINES TO BE PROCESSED |
|---|---|
| 1 | INPUT |
| 2 | GEQ 1 |
| 3 | GEQ 2 |
| 4 | GEQ 3 |
| 5 | GEQ 4 |
| 6 | GEQ 5 |
| 7 | GEQ 6 |
| 8 | GEQ 7 |
| 9 | OUTPUT 1, 2 |

| ORDER | ROUTINES TO BE PROCESSED |
|---|---|
| 1 | INPUT |
| 2 | GEQ 1 |
| 3 | GEQ 2 |
| 4 | GEQ 3 |
| 5 | OUTPUT 1<br>INPUT |
| 6 | GEQ 5 |
| 7 | GEQ 6 |
| 8 | GEQ 7 |
| 9 | OUTPUT 2 |

DIGITAL AUDIO SIGNAL PROCESSING APPARATUS

BACKGROUND OF THE INVENTION

1) Field of the Invention

The present invention relates to a digital audio signal processing apparatus.

2) Description of the Related Art

It has heretofore been known a digital audio signal processing apparatus which can provide a sound field control and tone control, which is disclosed in, for example, Japanese Patent Laid-Open No. 72615/1989. Such a digital audio signal processing apparatus is provided with a DSP (Digital Signal Processor) of a type wherein an audio signal issued from an audio signal source such as a tuner, etc. is subjected to digital processing to provide a sound filed control and tone control. The DSP includes not only an arithmetic operation means for performing arithmetic operation processing such as four rules of arithmetics but also a data memory for storing therein audio signal data to be supplied to the arithmetic operation means and a coefficient memory for storing therein coefficient data multiplied by signal data stored in the data memory. In addition, the DSP is so constructed that a delay memory for delaying the signal data can externally be provided. Furthermore, the DSP is also provided with a delay-time memory for storing therein delay-time data representative of the time required to take from writing of the signal data into the delay memory to reading of the same therefrom. In the DSP, the data transfer is performed between memories in accordance with a processing program or the data is transferred to the arithmetic operation means from the memory and therefore the arithmetic operation of the signal data is repeatedly carried out at a high speed. For example, input signal data is applied to the delay memory for producing delayed signal data. The delayed signal data is transferred to the arithmetic operation means through the data memory in order to be multiplied by the coefficient data, whereby reflected sound data in which attenuation in level is taken into consideration is obtained, thus making it possible to define an acoustic space. It has also been practiced to form a graphic equalizer by the arithmetic operation processing for thereby subjecting signal data to tone control.

In addition, new data and processing programs are fed from a microcomputer provided on the outside of the DSP each time the control mode is changed by a prescribed operation, so that the data and the processing programs in the DSP are rewritten, thus enabling various arithmetic operation processing.

However, in such a digital audio signal data processing apparatus, since the number of per-unit bits of data or programs, which can be transmitted by the microcomputer, is normally smaller than that of data controlled by the DSP, the rate of transferring the coefficient data or programs from the microcomputer to the memory is slow. A relatively long time was thus required to rewrite the data or programs. For example, even in the case of use of the same graphic equalizers of such a type that arithmetic operation processing which defines a graphic equalizer of two-channel common type comprising a plurality of bands is changed to arithmetic operation processing which defines a graphic equalizer of separated two-channel type ccmprising a plurality of bands in accordance with a mode change-over, a relatively long time was necessary for rewriting of the programs.

In addition, since the data or programs must be stored in the memory for each mode on the side of the microcomputer with a view toward causing the DSP to carry out various arithmetic operation processing in the operation mode, the prior art is accompanied by the problem in that the memory is required to have a large capacity.

SUMMARY OF THE INVENTION

With the foregoing problem in view, it is an object of this invention to provide a digital audio signal processing apparatus of a type wherein where it is desired to carry out a change in the mode from arithmetic operation processing which defines a graphic equalizer of two-channel common type comprising a plurality of bands to arithmetic operation processing which defines a graphic equalizer of separated two-channel type comprising a plurality of bands or to the contrary, where it is desired to perform a change in the mode from arithmetic operation processing which defines a graphic equalizer of separated two-channel type comprising a plurality of bands to arithmetic operation processing which defines a graphic equalizer of one channel type comprising a plurality of bands, the change in the arithmetic operation processing can be completed in a relatively short time and the storage capacity for the program can be reduced.

According to one aspect of this invention, there is provided a digital audio signal processing apparatus comprising storing means for storing therein an input digital audio signal subjected to sampling as data and arithmetic operation means for subjecting a graphic equalizer supplied with the data stored in the storing means and comprising a plurality of filters connected in series to one another to arithmetic operation processing so as to define the graphic equalizer for thereby outputting the result of its arithmetic operation as data therefrom and at least two output terminals supplied with output data of the arithmetic operation means, the apparatus being characterized in that when a change-over command is generated, one filter out of the plurality of filters except for filters positioned at both ends is supplied to one of the two output terminals with output data of a filter immediately before said one filter, the data stored in the storing means is applied to the input of a filter immediately after said one filter and output data of a final filter is applied to the other of the two output terminals.

The above and other objects, features and advantages of the present invention will become apparent from the following description and the appended claims, taken in conjunction with the accompanying drawings in which a preferred embodiment of the present invention is shown by way of illustrative example.

BRIEF DESCRIPTION OF THE DRAWINGS

FIGS. 3(*a*) and 3(*b*) are diagrams for describing programs to be processed by a DSP used in the apparatus of FIG. 1;

DETAILED DESCRIPTION OF THE PREFERRED EMBODIMENTS

Figure 1:
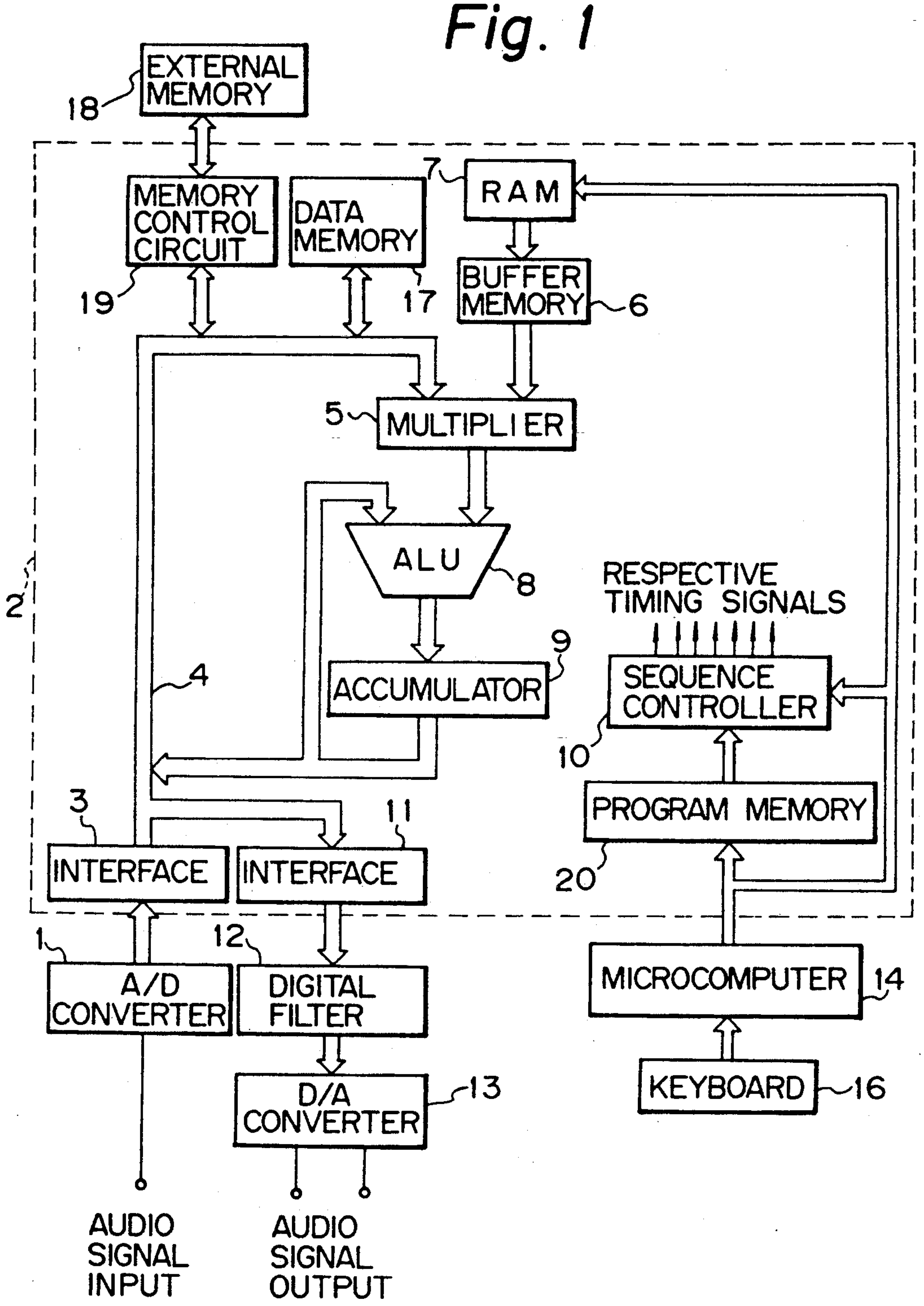
FIG. 1 is a block diagram showing a digital audio signal processing apparatus according to one embodiment of the present invention.

In a digital audio signal processing apparatus according to the present invention shown in FIG. 1, an analog audio signal is A/D converted by an A/D converter 1 into a digital signal in order to be supplied to an input interface in a DSP 2. A data bus 4 is connected to the input interface 3. The data bus 4 is also connected to a data memory 17 for temporarily storing a group of data therein and one of the inputs of a multiplier 5. A buffer memory 6 for holding coefficient data therein is connected to the other of the inputs of the multiplier 5. A coefficient RAM 7 is coupled to the buffer memory 6 and stores therein a plurality of coefficient data. One coefficient data is sequentially read out of the group of coefficient data stored in the RAM 7 in response to a timing signal from a sequence controller 10 to be described later, and the read coefficient data is supplied to the buffer memory 6 for holding therein. The coefficient data retained in the buffer memory 6 is applied to the multiplier 5. An ALU (Arithmetic Logic Unit) 8 is provided to accumulate an output data calculated by the multiplier 5. The output data calculated by the multiplier 5 is supplied to one of the inputs of the ALU 8, whereas the data bus 4 is connected to the other thereof. An accumulator 9 is coupled to an output terminal for calculation of the ALU 8. The data bus 4 is connected to the output terminal of the accumulator 9. Connected to the data bus 4 is a memory control circuit 19 for controlling writing of data from an external memory 18 therein and reading of the same therefrom in order to produce delay data.

In addition, an output interface 11 is connected to the data bus 4. A digital audio signal issued from the output interface 11 is supplied to a D/A converter 13 through a digital filter 12. The D/A converter 13 outputs audio signals for the front and rear channels.

The operation timing of each of the A/D converter 1, the interfaces 3, 11, the multiplier 5, the coefficient RAM 7, the ALU 8, the accumulator 9 and the memory control circuit 19 is controlled by the sequence controller 10. The sequence controller 10 is activated in accordance with a processing program written into a program memory 20 and operated in response to a command from a microcomputer 14.

A keyboard 16 is connected to the microcomputer 14. The keyboard 16 has a plurality of keys each of which designates the sound field at, for example, hall 1, hall 2, ... having different sound field characteristics. By operating these keys, the microcomputer 14 controls rewriting of the processing program into the program memory 20 and the coefficient data into the RAM 7.

In the above-described arrangement, the audio signal supplied to the A/D converter 1 is converted into the digital audio signal data for each predetermined sampling period to be applied to the data memory 17 through the interface 3. On the other hand, coefficient data read out from the RAM 7 is supplied to the buffer memory 6 to be stored therein. The sequence controller 10 provides timing for reading data from the interface 3, timing for selectively transferring data from the data memory 17 to the multiplier 5, timing for outputting respective coefficient data from the RAM 7, timing for performing the operation of multiplication by the multiplier 5, timing for performing the operation of addition by the ALU 8, timing for outputting data from the accumulator 9, timing for outputting data as the result of calculation from the interface 11 and the like. By appropriately providing each timing, for example, coefficient data $\alpha_1$ is supplied to the multiplier 5 from the buffer memory 6, while data $d_1$ is supplied to the multiplier 5 from the data memory 17. $\alpha_1.d_1$ is first subjected to arithmetic operation processing in the multiplier 5. When the $\alpha_1.d_1$ is calculated, $O+\alpha_1.d_1$ is calculated in the ALU 8. The result of its calculation is stored in the accumulator 9. Next, when coefficient data $\alpha_2$ is issued from the buffer memory 6 and data $d_2$ is issued from the data memory 17, $\alpha_2.d_2$ is calculated in the multiplier 5, and $\alpha_1.d_1$ is issued from the accumulator 9. In addition, $\alpha_1.d_1+\alpha_2.d_2$ is calculated in the ALU 8. The result of this calculation is held in the accumulator 9. By repeating this operation, $\Sigma\alpha_i.d_i$ which is a sum of products for realizing such as a graphic equalizer is calculated.

Where it is desired to produce delay data, data is read out from the data memory 17, and the read data is applied to the memory control circuit 19 through the data bus 4. The memory control circuit 19 sequentially writes therein data supplied to the external memory 18. Thereafter, the memory control circuit 19 reads out the data therefrom after a predetermined delay time has elapsed, to provide the same as delay data. The delay data is supplied to the data memory 17 through the data bus 4 in order to be stored therein, which data is used to perform the above-described arithmetic operation.

Figures 2, 3A, 3B:
FIG. 2 is a block diagram showing a 7 band-type graphic equalizer defined by arithmetic operation processing in the apparatus of FIG. 1.

In the digital audio signal processing apparatus according to the present invention, where it is desired to form or define a graphic equalizer of 7 bands, which provides two outputs of the front and rear channels, by using 7 filters of GEQ1 through GEQ7, as shown in FIG. 2, processing programs arranged in processing order shown in FIG. 3(*a*) are written into the program memory 20 by the microcomputer 14. Namely, data is first supplied to the graphic equalizer in accordance with the first processing routine. Then, the filter GEQ1 of 1 band (one-frequency band) is defined by the arithmetic operation processing in accordance with the second processing routine, and the filter GEQ2 of 1 band is defined by the arithmetic operation processing in accordance with the third processing routine. The same processing is hereinafter carried out until the seventh processing routine. Finally, the filter GEQ7 of 1 band is defined by the arithmetic operation processing in accordance with the eighth processing routine. Then, the result of calculation, that is, the output data from the filter GEQ7 is supplied to the first output terminal OUT1 and the second output terminal OUT2 as the front channel or rear channel in accordance with the ninth processing routine.

A description will now be made of the operation of the graphic equalizer of 1 band. This operation is as follows. An audio signal data $d_n$ is first read from a location of n in the data memory 17 in the first step. In addition, the coefficient data $\alpha_1$ is read out from the RAM 7 in order to be transferred to the buffer memory 6, where the data $\alpha_1$ is multiplied by the data $d_n$ in the multiplier 5. Then, the ALU 8 adds 0 to the result of multiplication, i.e., $\alpha_1.d_n$ generated from the multiplier 5 in the third step after two steps, and the result of its addition is held in the accumulator 9.

In the second step, signal data $d_{n-1}$ is read out from a location of $n-1$ in the data memory 17. Then, the read signal data $d_{n-1}$ is multiplied by coefficient data $\alpha_2$ read newly from the RAM 7 in the mulfiplier 5. The ALU 8 adds the value (the result of addition in the third step) retained in the accumulator 9 to the result of multiplication, i.e., $\alpha_2 .d_{n-1}$ in the fourth step. Then, the result of its addition is stored in the accumulator 9. Next, the value (final calculated value of 1 band) $GEQ_{n-1}$ retained in the accumulator 9 is delivered to a location of $n-2$ in the data memory 17 and to the multiplier 5 and then multiplied by coefficient data $\alpha_3$ in the multiplier 5. Then, the ALU 8 adds the value (the result of addition in the fourth step) retained in the accumulator 9 to the result of multiplication, i.e., $\alpha_3.GEQ_{n-1}$ in the fifth step, and the result of its addition is stored in the accumulator 9.

In the fourth step, signal data $d_{n+2}$ is read out from a location of $n+2$ in the data memory 17. Then, the read signal data $d_{n+2}$ is multiplied by coefficient data $\alpha_4$ read newly from the RAM 7 in the multiplier 5. The ALU 8 then adds the value (the result of addition in the fifth step) retained in the accumulator 9 to the result of its multiplication, i.e., $\alpha_4.d_{n+2}$ in the sixth step, and the result of this addition is stored in the accumulator 9. In addition, in the fifth step, signal data $d_{n+1}$ is read out from a location of $n+1$ in the data memory 17. Then, the read signal data $d_{n+1}$ is multiplied by coefficient data $\alpha_5$ read from the RAM 7 in the multiplier 5. Next, the ALU 8 adds the value (the result of addition in the sixth step) stored in the accumulator 9 to the result of it multiplication, i.e., $\alpha_5.d_{n+1}$ in the seventh step, and the result of its addition is stored in the accumulator 9. In the above-described manner, the audio signal data of 1 band for the graphic equalizer can be obtained. Thus, the same operation as described above is carried out to obtain audio signal data corresponding to 7 bands. Incidentally, the respective coefficient data are read out from a memory in the microcomputer 14 in accordance with a level command for each band given from the keyboard 16 in order to be transferred to the RAM 7.

Figure 4:
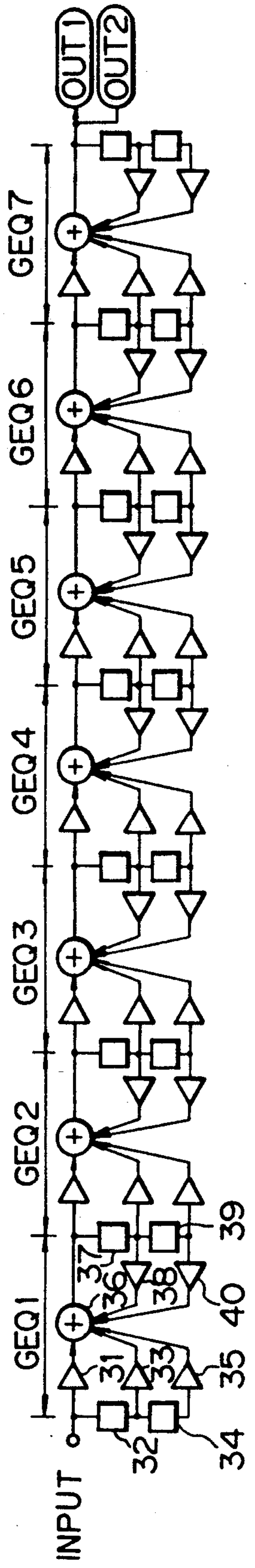
FIG. 4 is a circuit diagram showing an equivalent circuit which performs the same processing operation as the arithmetic operation processing of the 7 band-type graphic equalizer.

FIG. 4 shows an equivalent circuit which carries out the same processing operation as the arithmetic operation processing of the above 7 band-type graphic equalizer. The equivalent circuit is formed of a secondary IIR type filter for each band. A description will be made of the 1 band with reference to the filfer GEQ1. A coefficient multiplier 31 and a delay element 32 are connected to an input terminal supplied with a data signal. A coefficient multiplier 33 and a delay element 34 are coupled to the output of the delay element 32. Further, a coefficient multiplier 35 is connected to the output of the delay element 34. The respective outputs of the coefficient multipliers 31, 33, 35 are connected to an adder 36. The filter GEQ2 is coupled to the output of an adder 36 and a delay element 37 is also connected thereto. A coefficient multiplier 38 and a delay element 39 are connected to the output of the delay element 37. Further, a coefficient multiplier 40 is coupled to the output of the delay element 39. The respective outputs of the coefficient multipliers 38, 40 are also connected to the adder 36.

The delay time of each of the delay elements 32, 34, 37, 39 corresponds to the period for inputting data in response to the timing signal from the sequence controller 10, i.e., 1 sampling period. Thus, data to be supplied to the multiplier 33 is data of 1 sample before from the data supplied to the multiplier 31. In addition, data to be supplied to the multiplier 35 corresponds to data prior to two samples from the data supplied to the multiplier 31. Data to be supplied to the multipliers 38, 40 are also defined in the same manner as referred to above. The delay elements 37, 39 are used in common with respect to the filter GEQ2. The filters GEQ2 through GEQ7 are also constructed in the same manner as GEQ1.

Figure 5:
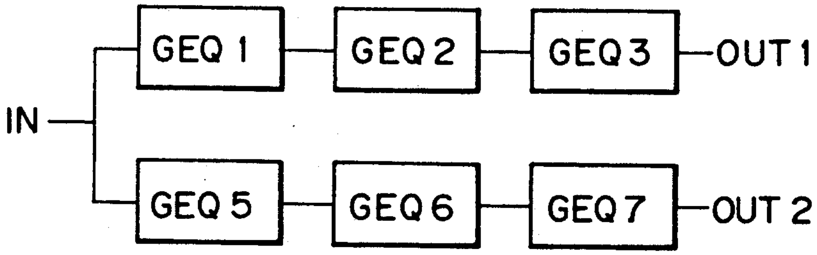
FIG. 5 is a block diagram showing two 3 band-type graphic equalizers each defined by tbe arithmetic operation processing in the apparatus of FIG. 1.

A description will now be made of a 3-band type graphic equalizer defined in the form of separated front and rear channels as shown in FIG. 5, in which a switching signal is produced by the key operation of the keyboard 16, so that a change in the mode is carried out.

The microcomputer 14 serves to rewrite programs in the program memory 20 into another in response to the switching signal. Upon its rewriting, the microcomputer 14 rewrites the fifth and ninth processing routines alone into others as shown in FIGS. 3(*a*) and 3(*b*). Other routines in the program memory 20 remains unchanged. By this rewriting operation, output data from tbe filter GEQ3 is supplied to the first output terminal OUT1 for the front channel in the fifth processing routine, and the same data as that supplied in the first processing routine is applied to the filter GEQ5. In addition, output data from the filter GEQ7 is applied to the second output terminal OUT2 for the rear channel in the ninth processing routine.

Figure 6:
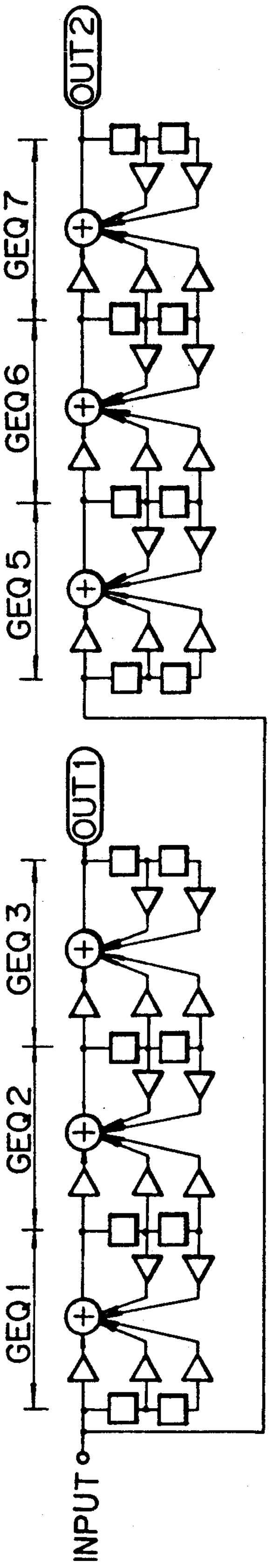
FIG. 6 is a circuit diagram showing an equivalent circuit which carries out the same processing operation as the arithmetic operation processing of each of the two 3 band-type graphic equalizers.

FIG. 6 shows an equivalent circuit which performs the same processing operation as the arithmetic operation of the above-described 3 band-type graphic equalizer. Namely, GEQ4 constituting part of the equivalent circuit of the 7 band-type graphic equalizer corresponds to the output terminal OUT1 and is also used as a circuit for supplying the data stored in the data memory 17 to GEQ5. In addition, the output terminals OUT1 and OUT2 are combined into only the output terminal OUT2.

Where it is desired to change the 7 band-type graphic equalizer to the two graphic equalizers of the 3 band-type, the characteristics of the center frequencies of the respective filters are also changed. This is practiced by changing the coefficient data in the RAM 7 by the microcomputer 14 upon change in the modes. Namely, it means that multiplication coefficients of all the multipliers employed in the equivalent circuit shown in FIG. 4 are changed.

A description has been made of the monaural signal in the above-described embodiment. On the other hand, in the case of a stereo signal, the above-described arithmetic operation is repeated by the number of stereo channels.

A further description has been made in the case where the 7 band-type graphic equalizer is changed to the two graphic equalizers of the 3 band-type in the above-described embodiment. However, where it is desired to change the two graphic equalizers of the 3 band-type to the 7 band-type graphic equalizer, its operation is also carried out in the same manner as that effected upon the above change. In addition, the respective operations effected when the 7 band-type graphic equalizer is changed to 2 band-type and 4 band-type graphic equalizers are also performed in the same manner as described above.

As described above, in the digital audio signal processing apparatus according to the present invention, the graphic equalizer serving to hold the input data therein and comprising a plurality of filters connected in series to one another is subjected to the arithmetic operation processing to be defined, so as to output the result of its processing as data therefrom. When a change-over command is generated, one filter out of the plurality of filters except for the filters arranged at the both ends is supplied to one of two output terminals with output data of a filter immediately before said one filter, the stored data is supplied to the input of a filter immediately after said one filter, and output data of a final filter is applied to the other of the two output terminals, whereby the two graphic equalizers are defined. Thus, where it is desired to carry out a change in the mode from arithmetic operation processing which defines a graphic equalizer of two-channel common type comprising a plurality of bands to arithmetic operation processing which defines a graphic equalizer of separated two-channel type comprising a plurality of bands or to the contrary, where it is desired to perform a change in the mode from arithmetic operation processing which defines a graphic equalizer of separated two-channel type comprising a plurality of bands to arithmetic operation processing which defines a graphic equalizer of one channel type comprising a plurality of bands, it is only necessary to change only a part of programs, and hence the change in the arithmetic operation processing can be completed in a relatively short time. As in the above-described embodiment, if the secondary IIR type filter is defined by program arithmetic operation processing by way of example, the mode change-over can be carried out in the decreased number of steps in particular, i.e., in a short time. It is also unnecessary to store all the programs corresponding to each of the modes in the memory. Accordingly, the storage capacity of the memory can be reduced and the occurrence of the malfunction can also be made less.

Having now fully described the invention, it will be apparent to those skilled in the art that many changes and modifications can be made without departing from the spirit or scope of the invention as set forth herein.

What is claimed is:

1. A digital audio signal processing apparatus, comprising:

storing means for storing therein an input digital audio signal subjected to sampling as data;

arithmetic operation means for implementing a graphic equalizer supplied with the data stored in said storing means and comprising a plurality of filters connected in series to one another, and subjecting said data to arithmetic operation processing for each sampling period so as to define said graphic equalizer for thereby outputting the result of its arithmetic operation as output data therefrom; and output means for supplying said output data to at least two output terminals;

said apparatus being characterized in that when a change-over command is generated, one filter out of said plurality of series connected filters, except for filters positioned at both ends of the series, operates as data supply means for supplying not only output data issued from a filter immediately before said one filter to one of said two output terminals but also the data stored in said storing means is applied to the input of a filter immediately after said one filter and said output means supplies output data issued via a final filter of said series and at least said filter immediately following said one filter to the other of said two output terminals.

2. A digital audio signal processing apparatus according to claim 1, wherein said arithmetic operation means and said output means perform operations in accordance with a program comprising a plurality of processing routines stored in a program memory, so that two processing routines are derived in order to obtain said data supply means and to supply said output data of a final filter to the other terminal in response to a mode change-over command.

3. A digital audio signal processing apparatus according to claim 1, wherein each of said plurality of filters comprise secondary IIR type filters respectively.

4. A digital audio signal processing apparatus according to claim 3, wherein said secondary IIR type filter is realized by an arithmetic operation according to a program.

* * * * *